(12) United States Patent
Choi

(10) Patent No.: US 12,289,102 B2
(45) Date of Patent: Apr. 29, 2025

(54) IMPEDANCE CALIBRATION CIRCUIT AND SEMICONDUCTOR APPARATUS INCLUDING THE IMPEDANCE CALIBRATION CIRCUIT

(71) Applicant: SK hynix Inc., Icheon-si (KR)

(72) Inventor: Eun Ji Choi, Icheon-si (KR)

(73) Assignee: SK hynix Inc., Icheon (KR)

( * ) Notice: Subject to any disclaimer, the term of this patent is extended or adjusted under 35 U.S.C. 154(b) by 38 days.

(21) Appl. No.: 18/085,439

(22) Filed: Dec. 20, 2022

(65) Prior Publication Data

US 2024/0014816 A1  Jan. 11, 2024

(30) Foreign Application Priority Data

Jul. 6, 2022  (KR) .......................... 10-2022-0082980

(51) Int. Cl.
 *H03K 19/00* (2006.01)
 *H03K 19/0185* (2006.01)

(52) U.S. Cl.
 CPC . *H03K 19/0005* (2013.01); *H03K 19/018585* (2013.01)

(58) Field of Classification Search
 CPC ....... H03K 19/0005; H03K 19/018585; H03K 19/0013; H03K 19/017509; H03K 19/017554; H03K 19/017581; H03K 19/018571
 See application file for complete search history.

(56) References Cited

U.S. PATENT DOCUMENTS

| | | | |
|---|---|---|---|
| 11,115,021 B2 * | 9/2021 | Kim ........................ | G11C 8/10 |
| 11,190,185 B2 | 11/2021 | Choi et al. | |
| 11,335,386 B1 * | 5/2022 | Hong ................... | G11C 7/1048 |
| 2014/0002130 A1 * | 1/2014 | Jang .................... | H03K 17/166 |
| | | | 326/30 |
| 2015/0091611 A1 * | 4/2015 | Jeong .................... | H04L 25/028 |
| | | | 326/30 |
| 2017/0331476 A1 | 11/2017 | Cho et al. | |
| 2021/0194485 A1 * | 6/2021 | Choi .................. | H03K 19/0005 |

* cited by examiner

*Primary Examiner* — Tuan T Lam
(74) *Attorney, Agent, or Firm* — WILLIAM PARK & ASSOCIATES LTD.

(57) ABSTRACT

An impedance calibration circuit includes a first leg set having an impedance calibrated to a first target impedance according to an impedance control code during an activation period of a first timing control signal, a second leg set having an impedance calibrated to a second target impedance according to the impedance control code during an activation period of a second timing control signal, a code generation circuit configured to calibrate and output a value of the impedance control code according to a result of comparing a voltage of a node, to which the first leg set is connected, with a reference voltage, and a timing control signal generation circuit configured to generate the first timing control signal and the second timing control signal having different activation periods in response to an impedance calibration enable signal.

10 Claims, 12 Drawing Sheets

IMPEDANCE CALIBRATION CIRCUIT AND SEMICONDUCTOR APPARATUS INCLUDING THE IMPEDANCE CALIBRATION CIRCUIT

CROSS-REFERENCES TO RELATED APPLICATION

The present application claims priority under 35 U.S.C. § 119(a) to Korean application number 10-2022-0082980, filed on Jul. 6, 2022, in the Korean Intellectual Property Office, which is incorporated herein by reference in its entirety.

BACKGROUND

1. Technical Field

The present disclosure relates to a semiconductor circuit, and particularly, to an impedance calibration circuit and a semiconductor apparatus including the impedance calibration circuit.

2. Related Art

A semiconductor apparatus includes a transmission circuit for transmitting data to the outside of the semiconductor apparatus.

The transmission circuit needs to be designed to implement various impedances satisfying specifications for driving strength and termination of the semiconductor apparatus, and includes an impedance calibration circuit for this purpose.

The impedance calibration circuit implements an impedance satisfying specifications by using a code signal generated by calibrating an impedance of a circuit that duplicates a driver of the transmission circuit on the basis of an external resistor.

However, when a mismatch occurs in the impedance calibration process using the impedance calibration circuit, performance degradation and operation errors of the semiconductor apparatus may occur. Therefore, it is required to improve impedance calibration performance.

SUMMARY

An impedance calibration circuit in accordance with an embodiment of the present disclosure may include: a first leg set having an impedance calibrated to a first target impedance according to an impedance control code during an activation period of a first timing control signal; a second leg set having an impedance calibrated to a second target impedance according to the impedance control code during an activation period of a second timing control signal; a code generation circuit configured to calibrate and output a value of the impedance control code according to a result of comparing a voltage of a node, to which the first leg set is connected, with a reference voltage; and a timing control signal generation circuit configured to generate the first timing control signal and the second timing control signal having different activation periods in response to an impedance calibration enable signal.

An impedance calibration circuit in accordance with an embodiment of the present disclosure may include: a first leg set in which among first to third duplicate legs, the first duplicate leg is connected to an external resistor through a first node and the second duplicate leg and the third duplicate leg are connected to a second node, an impedance of the first leg set being calibrated to a first target impedance according to a first impedance control code and a second impedance control code during an activation period of a first timing control signal; a second leg set in which among fourth to sixth duplicate legs, the fourth duplicate leg is connected to the external resistor and the fifth duplicate leg and the sixth duplicate leg are connected to the second node, an impedance of the second leg set being calibrated to a second target impedance according to the first impedance control code and the second impedance control code during an activation period of a second timing control signal; a first code generation circuit configured to calibrate and output a value of the first impedance control code according to a result of comparing a voltage of the first node with a reference voltage, and to generate a first hold signal by detecting a completion state of the calibration of the first impedance control code; a second code generation circuit configured to calibrate and output a value of the second impedance control code according to a result of comparing a voltage of the second node with the reference voltage, and to generate a second hold signal by detecting a completion state of the calibration of the second impedance control code; and a timing control signal generation circuit configured to generate the first timing control signal and the second timing control signal having different activation periods in response to an impedance calibration enable signal and at least one of the first hold signal and the second hold signal.

A semiconductor apparatus in accordance with an embodiment of the present disclosure may include: a driver including a first leg group having an impedance that is calibrated to a first target impedance according to an impedance control code having a first value and a second leg group having an impedance that is calibrated to a second target impedance according to the impedance control code calibrated to a second value; and an impedance calibration circuit including a first leg set and a second leg set, and configured to generate the impedance control code having the first value by calibrating an impedance of the first leg set for a first time allocated to a first calibration loop and to generate the impedance control code calibrated to the second value by calibrating an impedance of the second leg set for a second time allocated to a second calibration loop so as not to overlap the first time.

DETAILED DESCRIPTION

Hereinafter, embodiments of the present disclosure will be described in more detail with reference to the accompanying drawings.

Various embodiments are directed to providing an impedance calibration circuit capable of improving impedance calibration performance and a semiconductor apparatus including the impedance calibration circuit.

Figure 1:
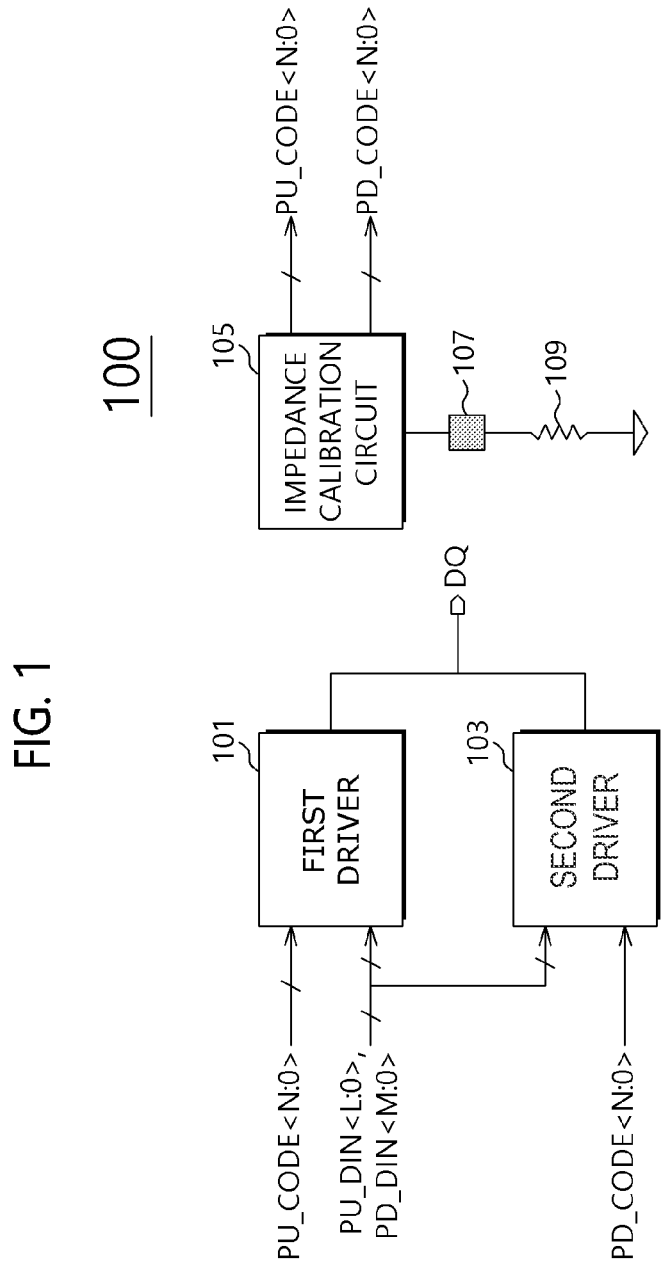
FIG. 1 is a diagram illustrating a configuration of a semiconductor apparatus in accordance with an embodiment of the present disclosure.

FIG. 1 is a diagram illustrating a configuration of a semiconductor apparatus 100 in accordance with an embodiment of the present disclosure.

Referring to FIG. 1, the semiconductor apparatus 100 in accordance with an embodiment of the present disclosure may include a first driver 101, a second driver 103, and an impedance calibration circuit 105.

The first driver 101 may be connected to an output terminal DQ of the semiconductor apparatus 100. The first driver 101 may have an impedance that is calibrated according to a first impedance control code PU_CODE<N:0>, and pull up the output terminal DQ according to data PU_DIN<L:0>.

The second driver 103 may be connected to the output terminal DQ of the semiconductor apparatus 100. The second driver 103 may have an impedance that is calibrated according to a second impedance control code PD_CODE<N:0>, and pull down the output terminal DQ according to data PD_DIN<M:0>.

The impedance calibration circuit 105 may be connected to an external resistor 109 through an external resistor pad 107. The impedance calibration circuit 105 may calibrate the first impedance control code PU_CODE<N:0> and the second impedance control code PD_CODE<N:0> with a resistance value of the external resistor 109 as a target value.

Hereinafter, an example in which when the resistance value of the external resistor 109 is set to 300 ohm, the first driver 101, the second driver 103, and the impedance calibration circuit 105 are designed to implement driving strength and termination impedances specified in the specifications of the semiconductor apparatus will be described with reference to FIGS. 2 to 6. In the example, the number N of bits of each of the first impedance control code PU_CODE<N:0> and the second impedance control code PD_CODE<N:0> is defined as 3, the number L of bits of the data PU_DIN<L:0> is defined as 4, and the number M of bits of the data PD_DIN<M:0> is defined as 3.

Figure 2:
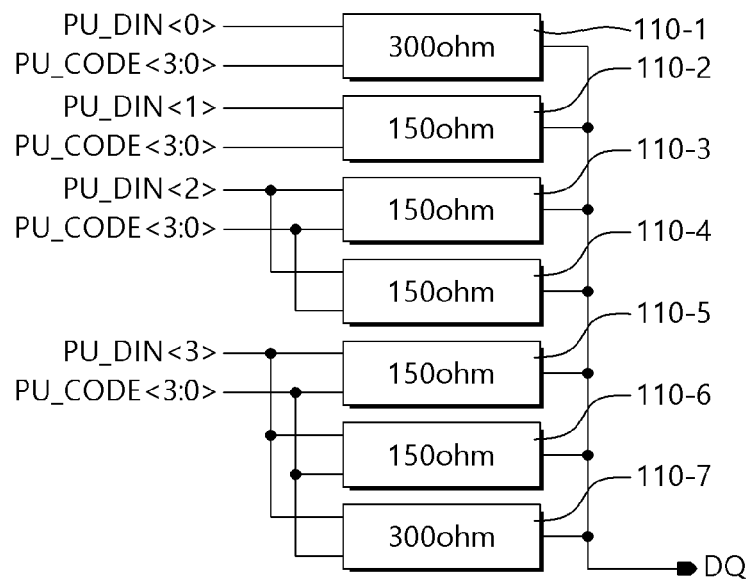
FIG. 2 is a diagram illustrating a configuration of a first driver in FIG. 1.

FIG. 2 is a diagram illustrating the configuration of the first driver 101 in FIG. 1.

Referring to FIG. 2, the first driver 101 may include a plurality of pull-up legs 300 ohm 110-1, 150 ohm 110-2, 150 ohm 110-3, 150 ohm 110-4, 150 ohm 110-5, 150 ohm 110-6, and 300 ohm 110-7.

The plurality of pull-up legs 300 ohm 110-1, 150 ohm 110-2, 150 ohm 110-3, 150 ohm 110-4, 150 ohm 110-5, 150 ohm 110-6, and 300 ohm 110-7 may be connected in common to the output terminal DQ. Among the plurality of pull-up legs 300 ohm 110-1, 150 ohm 110-2, 150 ohm 110-3, 150 ohm 110-4, 150 ohm 110-5, 150 ohm 110-6, and 300 ohm 110-7, the 300 ohm 110-1 and the 300 ohm 110-7 may each be designed to have substantially the same impedance as the resistance of the external resistor 109, that is, an impedance of 300 ohm. The 150 ohm 110-2 to the 150 ohm 110-6 may each be designed to have an impedance corresponding to ½ of the resistance of the resistance 109, that is, an impedance of 150 ohm. The plurality of pull-up legs 300 ohm 110-1, 150 ohm 110-2, 150 ohm 110-3, 150 ohm 110-4, 150 ohm 110-5, 150 ohm 110-6, and 300 ohm 110-7 may receive the first impedance control code PU_CODE<3:0> in common and selectively receive the data PU_DIN<3:0>. Among the data PU_DIN<3:0> input to the plurality of pull-up legs 300 ohm 110-1, 150 ohm 110-2, 150 ohm 110-3, 150 ohm 110-4, 150 ohm 110-5, 150 ohm 110-6, and 300 ohm 110-7, input of data to the other pull-up legs except for pull-up legs selected according to a driving strength may be blocked. For example, when a target value of the driving strength during a pull-up operation is 300 ohm, only PU_DIN<0> among the data PU_DIN<3:0> may be activated and PU_DIN<3:1> may be deactivated. In such a case, PU_DIN<3:1> may be deactivated by fixing each data to a high level regardless of an original value.

The 300 ohm 110-1 may receive the first impedance control code PU_CODE<3:0> and the data PU_DIN<0>. The 150 ohm 110-2 may receive the first impedance control code PU_CODE<3:0> and the data PU_DIN<1>. The 150 ohm 110-3 and the 150 ohm 110-4 may receive the first impedance control code PU_CODE<3:0> and the data PU_DIN<2> in common. The 150 ohm 110-5, the 150 ohm 110-6, and the 300 ohm 110-7 may receive the first impedance control code PU_CODE<3:0> and the data PU_DIN<3> in common.

The plurality of pull-up legs 300 ohm 110-1, 150 ohm 110-2, 150 ohm 110-3, 150 ohm 110-4, 150 ohm 110-5, 150 ohm 110-6, and 300 ohm 110-7 may be configured identically to one another except for a difference in size (gate width) between transistors constituting a pull-up leg having a target impedance of 300 ohm and a pull-up leg having a target impedance of 150 ohm. For example, the gate width of the transistors constituting the pull-up leg having a target impedance of 150 ohm may be twice the gate width of the transistors constituting the pull-up leg having a target impedance of 300 ohm. In a design process, the size of the transistor may be appropriately calibrated according to an impedance ratio.

Figure 3:
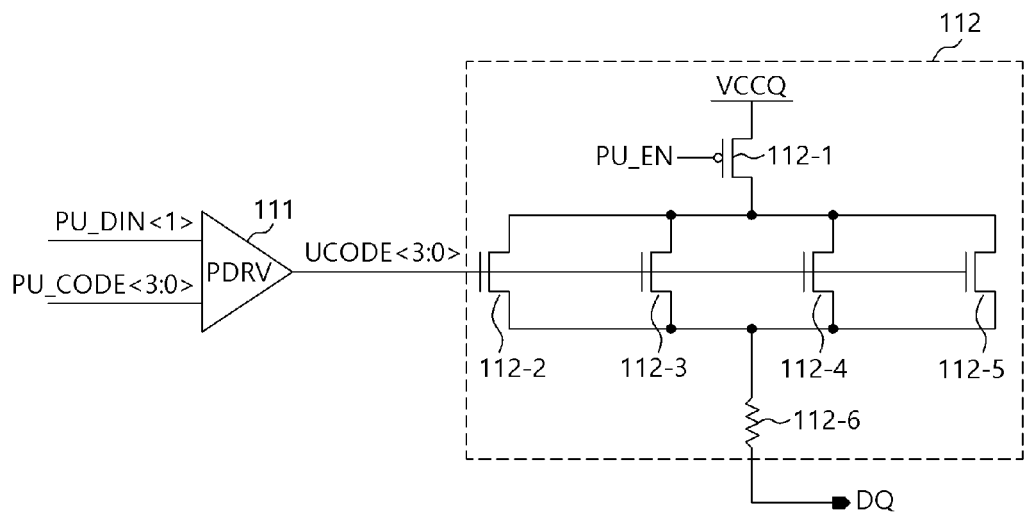
FIG. 3 is a diagram illustrating a configuration of any one of a plurality of pull-up legs in FIG. 2.

FIG. 3 is a diagram illustrating the configuration of any one of the plurality of pull-up legs 300 ohm 110-1, 150 ohm 110-2, 150 ohm 110-3, 150 ohm 110-4, 150 ohm 110-5, 150 ohm 110-6, and 300 ohm 110-7 in FIG. 2, for example, the 150 ohm 110-2.

Referring to FIG. 3, the 150 ohm 110-2 may include a pre-driving unit (PDRV) 111 and a main driving unit 112.

When the data PU_DIN<1> has a high level, the pre-driving unit PDRV 111 may provide the first impedance control code PU_CODE<3:0> to the main driving unit 112 as a first internal code signal UCODE<3:0>.

When a pull-up enable signal PU_EN has a low level, the main driving unit 112 may pull up the output terminal DQ to a target impedance, that is, 150 ohm, according to the first internal code signal UCODE<3:0>.

The main driving unit 112 may include first to fifth transistors 112-1 to 112-5 and a resistor 112-6. The first transistor 112-1 may have a source terminal connected to a power terminal VCCQ and receive the pull-up enable signal PU_EN through a gate terminal thereof. The pull-up enable signal PU_EN may substantially maintain a low level during a data transmission operation of the semiconductor apparatus and activate the plurality of pull-up legs 300 ohm 110-1, 150 ohm 110-2, 150 ohm 110-3, 150 ohm 110-4, 150 ohm 110-5, 150 ohm 110-6, and 300 ohm 110-7. In an embodiment, the pull-up enable signal PU_EN may substantially maintain a high level while no data transmission is performed and substantially prevent or mitigate unnecessary current consumption. Each of the second to fifth transistors 112-2 to 112-5 may have a drain terminal connected in common to a drain terminal of the first transistor 112-1, and receive the first internal code signal UCODE<3:0> on a bit basis through a gate terminal thereof. The resistor 112-6 may have one end connected in common to source terminals of the second to fifth transistors 112-2 to 112-5, and the other end connected to the output terminal DQ.

Figure 4:
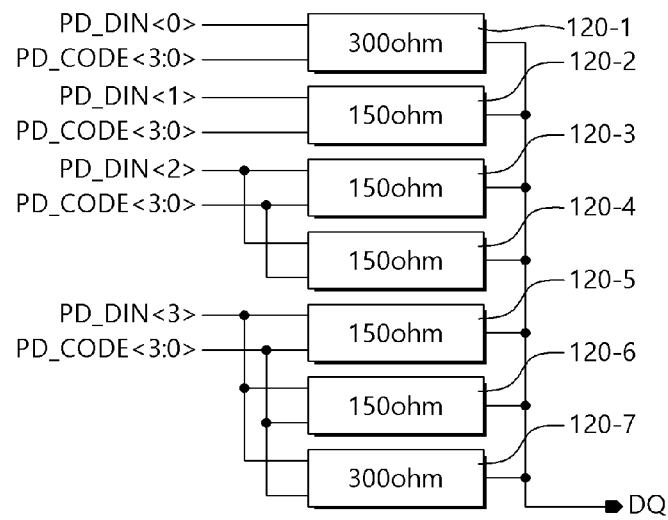
FIG. 4 is a diagram illustrating a configuration of a second driver in FIG. 1.

FIG. 4 is a diagram illustrating the configuration of the second driver 103 in FIG. 1.

Referring to FIG. 4, the second driver 103 may include a plurality of pull-down legs 300 ohm 120-1, 150 ohm 120-2, 150 ohm 120-3, 150 ohm 120-4, 150 ohm 120-5, 150 ohm 120-6, and 300 ohm 120-7.

The plurality of pull-down legs 300 ohm 120-1, 150 ohm 120-2, 150 ohm 120-3, 150 ohm 120-4, 150 ohm 120-5, 150 ohm 120-6, and 300 ohm 120-7 may be connected in common to the output terminal DQ. Among the plurality of pull-down legs 300 ohm 120-1, 150 ohm 120-2, 150 ohm 120-3, 150 ohm 120-4, 150 ohm 120-5, 150 ohm 120-6, and 300 ohm 120-7, the 300 ohm 120-1 may be designed to have an impedance of 300 ohm, the 150 ohm 120-2 to the 150 ohm 120-6 may each be designed to have an impedance of 150 ohm, and the 300 ohm 120-7 may be designed to have an impedance of 300 ohm. The plurality of pull-down legs 300 ohm 120-1, 150 ohm 120-2, 150 ohm 120-3, 150 ohm 120-4, 150 ohm 120-5, 150 ohm 120-6, and 300 ohm 120-7 may receive the second impedance control code PD_CODE<3:0> in common and selectively receive the data PD_DIN<3:0>.

The data PD_DIN<3:0> may have substantially the same value, but input of data to the remaining pull-down legs except for pull-down legs selected according to the driving strength among the data PD_DIN<3:0> may be blocked. For example, when a target value of the driving strength is 300 ohm during a pull-down operation, only PD_DIN<0> of the data PD_DIN<3:0> may be activated, and PD_DIN<3:1> may be deactivated. In such a case, PD_DIN<3:1> may be deactivated by fixing each data to a low level regardless of an original value.

The 300 ohm 120-1 may receive the second impedance control code PD_CODE<3:0> and the data PD_DIN<0>. The 150 ohm 120-2 may receive the second impedance control code PD_CODE<3:0> and the data PD_DIN<1>. The 150 ohm 120-3 and the 150 ohm 120-4 may receive the second impedance control code PD_CODE<3:0> and the data PD_DIN<2> in common. The 150 ohm 120-5, the 150 ohm 120-6, and the 300 ohm 120-7 may receive the second impedance control code PD_CODE<3:0> and the data PD_DIN<3> in common. The plurality of pull-down legs 300 ohm 120-1, 150 ohm 120-2, 150 ohm 120-3, 150 ohm 120-4, 150 ohm 120-5, 150 ohm 120-6, and 300 ohm 120-7 may be configured identically to one another except for a difference in size (gate width) between transistors constituting pull-down legs each having an impedance of 300 ohm and pull-down legs each having an impedance of 150 ohm.

Figure 5:
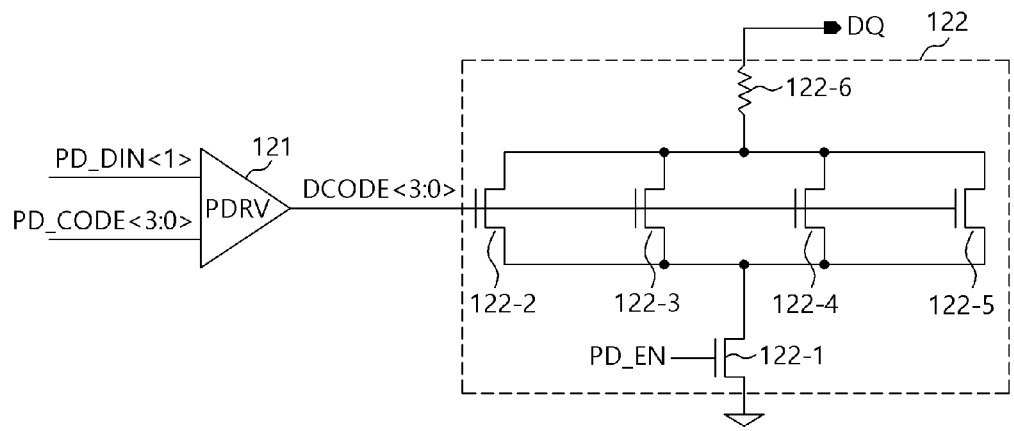
FIG. 5 is a diagram illustrating a configuration of any one of a plurality of pull-down legs in FIG. 4.

FIG. 5 is a diagram illustrating the configuration of any one of the plurality of pull-down legs 300 ohm 120-1, 150 ohm 120-2, 150 ohm 120-3, 150 ohm 120-4, 150 ohm 120-5, 150 ohm 120-6, and 300 ohm 120-7 in FIG. 4, for example, the 150 ohm 120-2.

Referring to FIG. 5, the 150 ohm 120-2 may include a pre-driving unit (PDRV) 121 and a main driving unit 122.

When the data PD_DIN<1> has a high level, the PDRV 121 may provide the second impedance control code PD_CODE<3:0> to the main driving unit 122 as a second internal code signal DCODE<3:0>.

When a pull-down enable signal PD_EN has a high level, the main driving unit 122 may pull down the output terminal DQ to a target impedance, that is, 150 ohm, according to the second internal code signal DCODE<3:0>.

The main driving unit 122 may include first to fifth transistors 122-1 to 122-5 and a resistor 122-6. The first transistor 122-1 may have a source terminal connected to a ground terminal and receive the pull-down enable signal PD_EN through a gate terminal thereof. The pull-down enable signal PD_EN may substantially maintain a high level during a data transmission operation and activate the plurality of pull-down legs 300 ohm 120-1, 150 ohm 120-2, 150 ohm 120-3, 150 ohm 120-4, 150 ohm 120-5, 150 ohm 120-6, and 300 ohm 120-7. In an embodiment, the pull-down enable signal PD_EN may substantially maintain a low level while no data transmission is performed and substantially prevent or mitigate unnecessary current consumption. Each of the second to fifth transistors 122-2 to 122-5 may have a drain terminal connected in common to a drain terminal of the first transistor 122-1, and receive the second internal code signal DCODE<3:0> on a bit basis through a gate terminal thereof. The resistor 122-6 may have one end connected in common to drain terminals of the second to fifth transistors 122-2 to 122-5, and the other end connected to the output terminal DQ.

Figure 6:
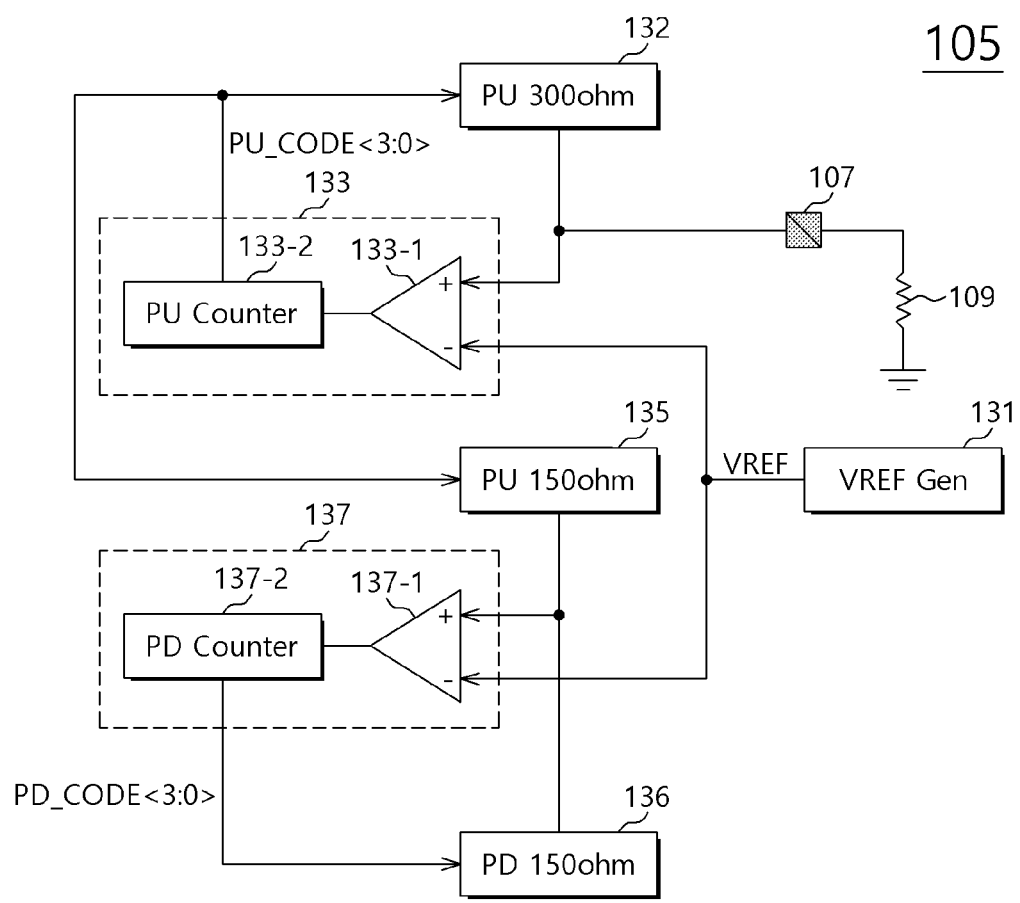
FIG. 6 is a diagram illustrating a configuration of an impedance calibration circuit in FIG. 1.

FIG. 6 is a diagram illustrating the configuration of the impedance calibration circuit 105 in FIG. 1.

Referring to FIG. 6, the impedance calibration circuit 105 may include a reference voltage generation circuit (VREF Gen) 131, a first duplicate leg PU 300 ohm 132, a second duplicate leg PU 150 ohm 135, a third duplicate leg PD 150 ohm 136, and a first code generation circuit 133, and a second code generation circuit 137.

The reference voltage generation circuit VREF Gen 131 may generate a reference voltage VREF. The reference voltage VREF may have a value of, for example, half (VCCQ/2) of a power supply voltage VCCQ.

An impedance of the first duplicate leg PU 300 ohm 132 may be calibrated according to the first impedance control code PU_CODE<3:0>. The first duplicate leg PU 300 ohm 132 may be configured by duplicating the pull-up leg 300 ohm 110-1 in FIG. 2, for example. The first duplicate leg PU 300 ohm 132 may be connected to the external resistor 109 via the external resistor pad 107.

An impedance of the second duplicate leg PU 150 ohm 135 may be calibrated according to the first impedance control code PU_CODE<3:0>. The second duplicate leg PU 150 ohm 135 may be configured by duplicating the pull-up leg 150 ohm 110-2 in FIG. 2, for example.

The impedance of the third duplicate leg PD 150 ohm 136 may be calibrated according to the second impedance control code PD_CODE<3:0>. The third duplicate leg PD 150 ohm 136 may be configured by duplicating the pull-down leg 150 ohm 120-2 in FIG. 4, for example.

The first code generation circuit 133 may calibrate a value of the first impedance control code PU_CODE<3:0> according to a result of comparing a voltage of a node, to which the first duplicate leg PU 300 ohm 132 and the external resistor 109 are connected, with the reference voltage VREF. The first code generation circuit 133 may include a first comparator 133-1 and a first counter PU Counter 133-2. The first comparator 133-1 may compare the voltage of the node, to which the first duplicate leg PU 300 ohm 132 and the external resistor 109 are connected, with the reference voltage VREF and output the comparison result. The first counter PU Counter 133-2 may calibrate the value of the first impedance control code PU_CODE<3:0> according to the output of the first comparator 133-1.

The second code generation circuit 137 may calibrate a value of the second impedance control code PD_CODE<3:0> according to a result of comparing a voltage of a node, to which the second duplicate leg PU 150 ohm 135 and the third duplicate leg PD 150 ohm 136 are connected, with the reference voltage VREF. The second code generation circuit 137 may include a second comparator 137-1 and a second counter PD Counter 137-2. The second comparator 137-1 may compare the voltage of the node, to which the second duplicate leg PU 150 ohm 135 and the third duplicate leg PD 150 ohm 136 are connected, with the reference voltage VREF and output the comparison result. The second counter PD Counter 137-2 may calibrate the value of the second impedance control code PD_CODE<3:0> according to the output of the second comparator 137-1.

Hereinafter, the operation of the above-described impedance calibration circuit 105 will be described.

Since the external resistor 109 is provided outside a chip, it may substantially maintain a constant resistance value, that is, 300 ohm regardless of an internal operating environment. An operation of calibrating the impedance of the first duplicate leg PU 300 ohm 132 with the resistance value of the external resistor 109 as a target value may be performed.

As the result of comparing the voltage of the node, to which the first duplicate leg PU 300 ohm 132 and the external resistor 109 are connected, with the reference voltage VREF, when the two values match each other within an error range, the calibration of the first impedance control code PU_CODE<3:0> may be completed.

Since the first impedance control code PU_CODE<3:0> is provided to the second duplicate leg PU 150 ohm 135, the impedance calibration operation of the second duplicate leg PU 150 ohm 135 may also be completed simultaneously with the impedance calibration operation of the first duplicate leg PU 300 ohm 132. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

Then, an operation of calibrating the impedance of the third duplicate leg PD 150 ohm 136 with the impedance of the second duplicate leg PU 150 ohm 135 as a target value may be performed.

As the result of comparing the voltage of the node, to which the second duplicate leg PU 150 ohm 135 and the third duplicate leg PD 150 ohm 136 are connected, with the reference voltage VREF, when the two values match each other within the error range, the calibration of the second impedance control code PD_CODE<3:0> may be completed.

Figure 7:
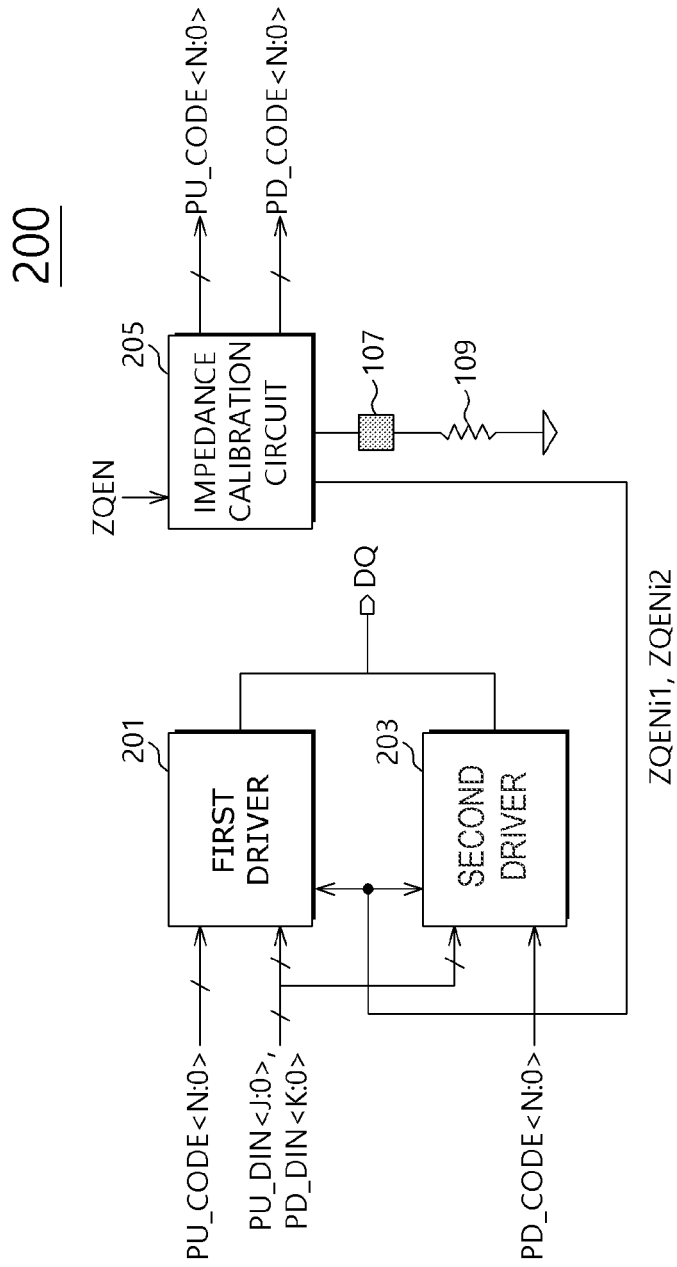
FIG. 7 is a diagram illustrating a configuration of a semiconductor apparatus in accordance with another embodiment of the present disclosure.

FIG. 7 is a diagram illustrating a configuration of a semiconductor apparatus 200 in accordance with another embodiment of the present disclosure.

Referring to FIG. 7, the semiconductor apparatus 200 in accordance with another embodiment of the present disclosure may include a first driver 201, a second driver 203, and an impedance calibration circuit 205.

The first driver 201 may receive a first impedance control code PU_CODE<N:0> according to a first timing control signal ZQENi1 and a second timing control signal ZQENi2. The first driver 201 may have an impedance that is calibrated according to the first impedance control code PU_CODE<N:0>, and pull up an output terminal DQ according to data PU_DIN<J:0>. The first driver 201 may include a plurality of pull-up legs. Some of the plurality of pull-up legs may receive the first impedance control code PU_CODE<N:0> for a time determined by the first timing control signal ZQENi1, and the rest of the plurality of pull-up legs may receive the first impedance control code PU_CODE<N:0> for a time determined by the second timing control signal ZQENi2. The first impedance control code PU_CODE<N:0> may have respective different values for the time determined by the first timing control signal ZQENi1 and the time determined by the second timing control signal ZQENi2.

The second driver 203 may receive a second impedance control code PD_CODE<N:0> according to the first timing control signal ZQENi1 and the second timing control signal ZQENi2. The second driver 203 may have an impedance that is calibrated the impedance according to the second impedance control code PD_CODE<N:0>, and pull down the output terminal DQ according to data PD_DIN<K:0>. The second driver 203 may include a plurality of pull-down legs. Some of the plurality of pull-down legs may receive the second impedance control code PD_CODE<N:0> for the time determined by the first timing control signal ZQENi1, and the rest of the plurality of pull-down legs may receive the second impedance control code PD_CODE<N:0> for the time determined by the second timing control signal ZQENi2. The second impedance control code PD_CODE<N:0> may have respective different values for the time determined by the first timing control signal ZQENi1 and the time determined by the second timing control signal ZQENi2.

The impedance calibration circuit 205 may include a first leg set and a second leg set that duplicate the plurality of pull-up legs and the plurality of pull-down legs, and may be configured to generate an impedance control code having a first value through impedance calibration of the first leg set for a time allocated to a first calibration loop and to generate an impedance control code calibrated to a second value through impedance calibration of the second leg set for a time allocated to a second calibration loop.

The impedance calibration circuit 205 may be connected to the external resistor 109 through the external resistor pad 107. The impedance calibration circuit 205 may receive an impedance calibration enable signal ZQEN, and output the first impedance control code PU_CODE<N:0>, the second impedance control code PD_CODE<N:0>, the first timing control signal ZQENi1, and the second timing control signal ZQENi2.

Hereinafter, an example in which when the resistance value of the external resistor 109 is set to 300 ohm, the first driver 201, the second driver 203, and the impedance calibration circuit 205 are designed to implement driving strength and termination impedances specified in the specifications of the semiconductor apparatus will be described with reference to FIGS. 8 to 14. In the example, the number N of bits of each of the first impedance control code PU_CODE<N:0> and the second impedance control code PD_CODE<N:0> is defined as 3, the number J of bits of the data PU_DIN<J:0> is defined as 3, and the number K of bits of the data PD_DIN<K:0> is defined as 3.

Figure 8:
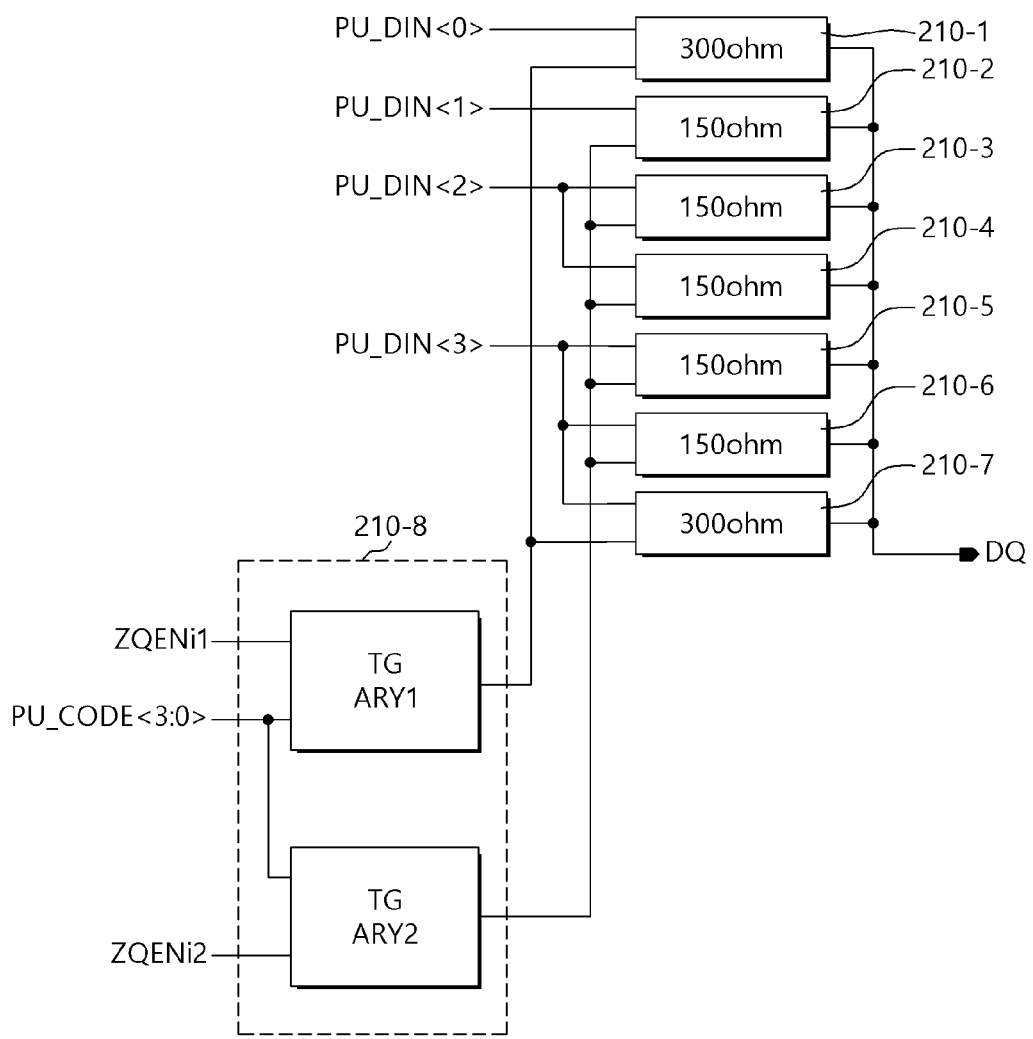
FIG. 8 is a diagram illustrating a configuration of a first driver in FIG. 7.

FIG. 8 is a diagram illustrating the configuration of the first driver 201 in FIG. 7.

Referring to FIG. 8, the first driver 201 may include a plurality of pull-up legs 300 ohm 210-1, 150 ohm 210-2, 150 ohm 210-3, 150 ohm 210-4, 150 ohm 210-5, 150 ohm 210-6, and 300 ohm 210-7, and a code transmission control circuit 210-8.

The plurality of pull-up legs 300 ohm 210-1, 150 ohm 210-2, 150 ohm 210-3, 150 ohm 210-4, 150 ohm 210-5, 150 ohm 210-6, and 300 ohm 210-7 may be connected in common to the output terminal DQ. The plurality of pull-up legs 300 ohm 210-1, 150 ohm 210-2, 150 ohm 210-3, 150 ohm 210-4, 150 ohm 210-5, 150 ohm 210-6, and 300 ohm 210-7 may be divided into a first pull-up leg group including the 300 ohm 210-1 and the 300 ohm 210-7, and a second pull-up leg group including the 150 ohm 210-2 to the 150 ohm 210-6.

Among the plurality of pull-up legs 300 ohm 210-1, 150 ohm 210-2, 150 ohm 210-3, 150 ohm 210-4, 150 ohm 210-5, 150 ohm 210-6, and 300 ohm 210-7, the pull-up leg 300 ohm 210-1 and the pull-up leg 300 ohm 210-7 may each be designed to have a first target impedance, that is, an impedance of 300 ohm substantially the same as the resistance of the external resistor 109. The pull-up leg 150 ohm 210-2 to the pull-up leg 150 ohm 210-6 may each be designed to have a second target impedance, that is, an impedance of 150 ohm corresponding to ½ of the resistance of the external resistor 109. The plurality of pull-up legs 300 ohm 210-1, 150 ohm 210-2, 150 ohm 210-3, 150 ohm 210-4, 150 ohm 210-5, 150 ohm 210-6, and 300 ohm 210-7 may receive the first impedance control code PU_CODE<3:0> and the data PU_DIN<3:0>. A value of the first impedance control code PU_CODE<3:0> input to the pull-up leg 300 ohm 210-1 and the pull-up leg 300 ohm 210-7 and a value of the first impedance control code PU_CODE<3:0> input to the pull-up leg 150 ohm 210-2 to the pull-up leg 150 ohm 210-6 may be different from each other.

The pull-up leg 300 ohm 210-1 may receive the first impedance control code PU_CODE<3:0> and the data PU_DIN<0>. The pull-up leg 150 ohm 210-2 may receive the first impedance control code PU_CODE<3:0> and the data PU_DIN<1>. The pull-up leg 150 ohm 210-3 and the pull-up leg 150 ohm 210-4 may receive the first impedance control code PU_CODE<3:0> and the data PU_DIN<2> in common. The pull-up leg 150 ohm 210-5, the pull-up leg 150 ohm 210-6, and the pull-up leg 300 ohm 210-7 may receive the first impedance control code PU_CODE<3:0> and the data PU_DIN<3> in common. The circuit configurations of the plurality of pull-up legs 300 ohm 210-1, 150 ohm 210-2, 150 ohm 210-3, 150 ohm 210-4, 150 ohm 210-5, 150 ohm 210-6, and 300 ohm 210-7 may be substantially the same as one another, but sizes (gate widths) of transistors may be different according to a target impedance.

The code transmission control circuit 210-8 may receive the first impedance control code PU_CODE<3:0>, the first timing control signal ZQENi1, and the second timing control signal ZQENi2. The code transmission control circuit 210-8 may provide the first impedance control code PU_CODE<3:0> to pull-up legs designed to have the first target impedance among the plurality of pull-up legs for the time determined by the first timing control signal ZQENi1, that is, the pull-up leg 300 ohm 210-1 and the pull-up leg 300 ohm 210-7, and provide the first impedance control code PU_CODE<3:0> to pull-up legs designed to have the second target impedance among the plurality of pull-up legs for the time determined by the second timing control signal ZQENi2, that is, the pull-up leg 150 ohm 210-2 to the pull-up leg 150 ohm 210-6.

The code transmission control circuit 210-8 may include a first transmission gate array TG ARY1 and a second transmission gate array TG ARY2. The first transmission gate array TG ARY1 may provide the first impedance control code PU_CODE<3:0> to the pull-up leg 300 ohm 210-1 and the pull-up leg 300 ohm 210-7 for the time determined by the first timing control signal ZQENi1. The second transmission gate array TG ARY2 may provide the first impedance control code PU_CODE<3:0> to the pull-up leg 150 ohm 210-2 to the pull-up leg 150 ohm 210-6 for the time determined by the second timing control signal ZQENi2.

Figure 9:
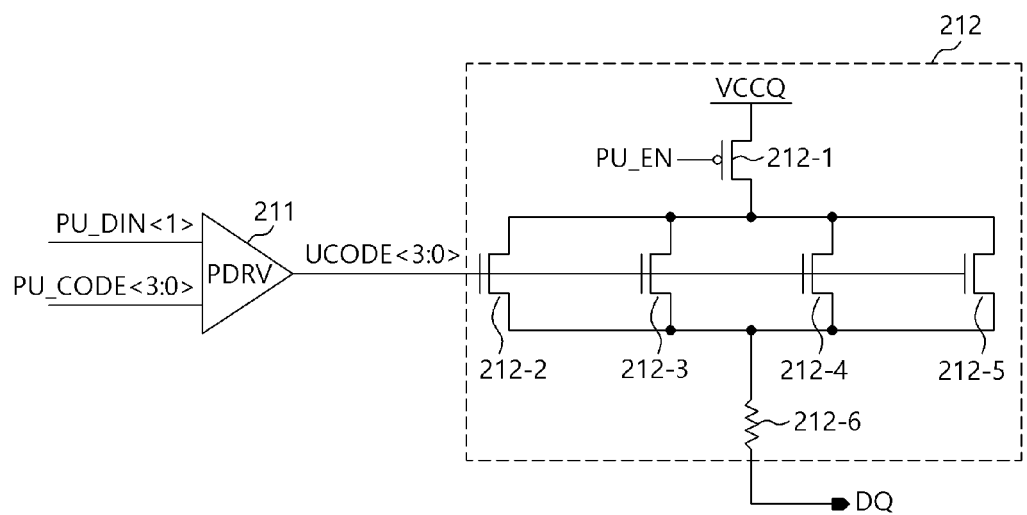
FIG. 9 is a diagram illustrating a configuration of any one of a plurality of pull-up legs in FIG. 8.

FIG. 9 is a diagram illustrating the configuration of any one of the plurality of pull-up legs 300 ohm 210-1, 150 ohm 210-2, 150 ohm 210-3, 150 ohm 210-4, 150 ohm 210-5, 150 ohm 210-6, and 300 ohm 210-7 in FIG. 8, for example, the pull-up leg 150 ohm 210-2.

Referring to FIG. 9, the pull-up leg 150 ohm 210-2 may include a pre-driving unit PDRV 211 and a main driving unit 212, and a circuit connection configuration may be substantially the same as that of FIG. 3. For this example, though, the main driving unit 212 may include first to fifth transistors 212-1 to 212-5 and a resistor 212-6.

Figure 10:
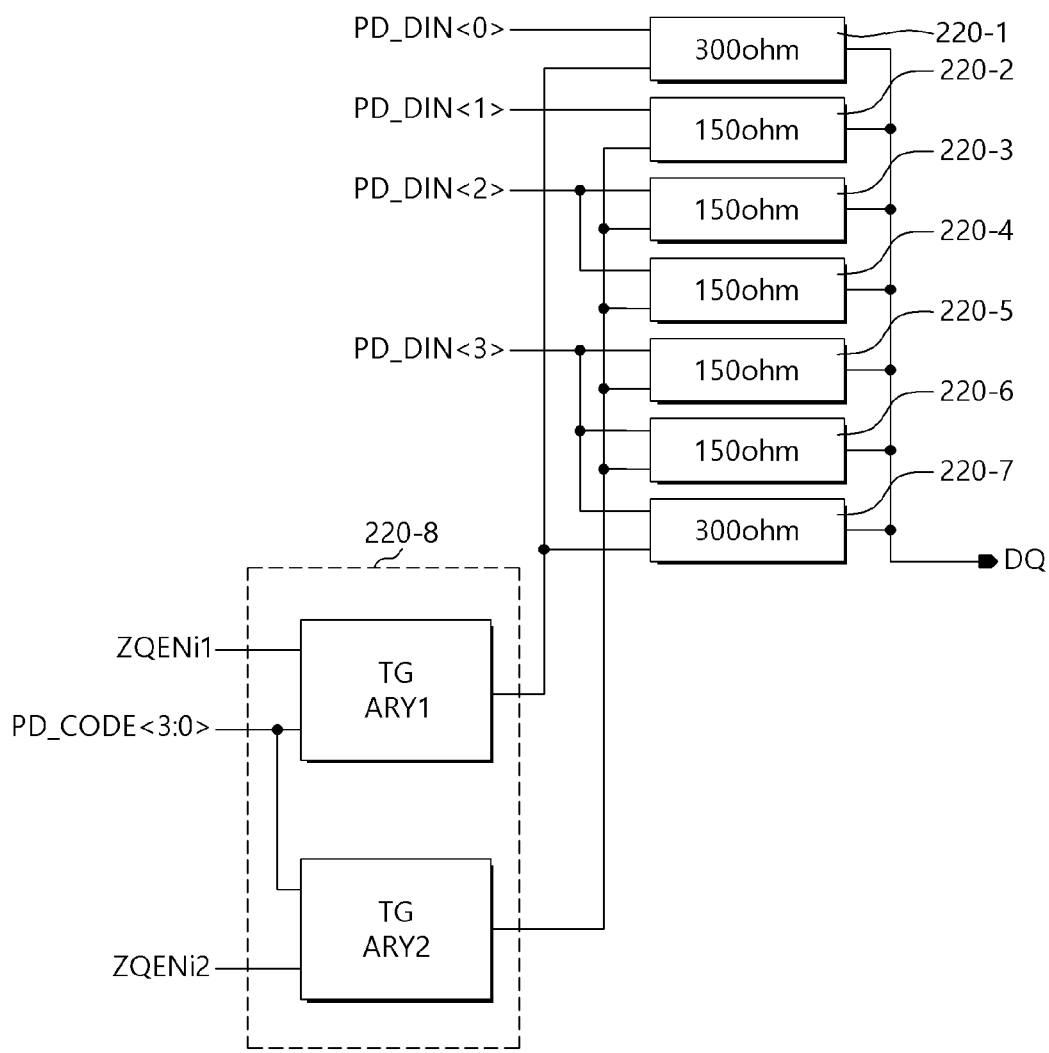
FIG. 10 is a diagram illustrating a configuration of a second driver in FIG. 7.

FIG. 10 is a diagram illustrating the configuration of the second driver 203 in FIG. 7.

Referring to FIG. 10, the second driver 203 may include a plurality of pull-down legs 300 ohm 220-1, 150 ohm 220-2, 150 ohm 220-3, 150 ohm 220-4, 150 ohm 220-5, 150 ohm 220-6, and 300 ohm 220-7, and a code transmission control circuit 220-8.

The plurality of pull-down legs 300 ohm 220-1, 150 ohm 220-2, 150 ohm 220-3, 150 ohm 220-4, 150 ohm 220-5, 150 ohm 220-6, and 300 ohm 220-7 may be connected in common to the output terminal DQ. The plurality of pull-down legs 300 ohm 220-1, 150 ohm 220-2, 150 ohm 220-3, 150 ohm 220-4, 150 ohm 220-5, 150 ohm 220-6, and 300 ohm 220-7 may be divided into a first pull-down leg group including the pull-down leg 300 ohm 220-1 and the pull-down leg 300 ohm 220-7, and a second pull-down leg group including the pull-down leg 150 ohm 220-2 to the pull-down leg 150 ohm 220-6.

Among the plurality of pull-down legs 300 ohm 220-1, 150 ohm 220-2, 150 ohm 220-3, 150 ohm 220-4, 150 ohm 220-5, 150 ohm 220-6, and 300 ohm 220-7, the pull-down leg 300 ohm 220-1 and the pull-down leg 300 ohm 220-7 may each be designed to have the first target impedance, that is, an impedance of 300 ohm substantially the same as the resistance of the external resistor 109. The pull-down leg 150 ohm 220-2 to the pull-down leg 150 ohm 220-6 may each be designed to have the second target impedance, that is, an impedance of 150 ohm corresponding to ½ of the resistance of the external resistor 109. The plurality of pull-down legs 300 ohm 220-1, 150 ohm 220-2, 150 ohm 220-3, 150 ohm 220-4, 150 ohm 220-5, 150 ohm 220-6, and 300 ohm 220-7 may receive the second impedance control code PD_CODE<3:0> and the data PD_DIN<3:0>. A value of the second impedance control code PD_CODE<3:0> input to the pull-down leg 300 ohm 220-1 and the pull-down leg 300 ohm 220-7 and a value of the second impedance control code PD_CODE<3:0> input to the pull-down leg 150 ohm 220-2 to the pull-down leg 150 ohm 220-6 may be different from each other.

The pull-down leg 300 ohm 220-1 may receive the second impedance control code PD_CODE<3:0> and the data PD_DIN<0>. The pull-down leg 150 ohm 220-2 may receive the second impedance control code PD_CODE<3:0> and the data PD_DIN<1>. The pull-down leg 150 ohm 220-3 and the pull-down leg 150 ohm 220-4 may receive the second impedance control code PD_CODE<3:0> and the data PD_DIN<2> in common. The pull-down leg 150 ohm 220-5, the pull-down leg 150 ohm 220-6, and the pull-down leg 300 ohm 220-7 may receive the second impedance control code PD_CODE<3:0> and the data PD_DIN<3> in common. The circuit configurations of the plurality of pull-down legs 300 ohm 220-1, 150 ohm 220-2, 150 ohm 220-3, 150 ohm 220-4, 150 ohm 220-5, 150 ohm 220-6, and 300 ohm 220-7 may be substantially the same as one another, but sizes (gate widths) of transistors may be different according to a target impedance.

The code transmission control circuit 220-8 may receive the second impedance control code PD_CODE<3:0>, the first timing control signal ZQENi1, and the second timing control signal ZQENi2. The code transmission control circuit 220-8 may provide the second impedance control code PD_CODE<3:0> to pull-down legs designed to have the first target impedance among the plurality of pull-down legs for the time determined by the first timing control signal ZQENi1, that is, the 300 ohm 220-1 and the 300 ohm 220-7, and provide the second impedance control code PD_CODE<3:0> to pull-down legs designed to have the second target impedance among the plurality of pull-down legs for the time determined by the second timing control signal ZQENi2, that is, the pull-down leg 150 ohm 220-2 to the pull-down leg 150 ohm 220-6.

The code transmission control circuit 220-8 may include a first transmission gate array TG ARY1 and a second transmission gate array TG ARY2. The TG ARY1 may provide the second impedance control code PD_CODE<3:0> to the pull-down leg 300 ohm 220-1 and the pull-down leg 300 ohm 220-7 for the time determined by the first timing control signal ZQENi1. The TG ARY2 may provide the second impedance control code PD_CODE<3:0> to the pull-down leg 150 ohm 220-2 to the pull-down leg 150 ohm 220-6 for the time determined by the second timing control signal ZQENi2.

Figure 11:
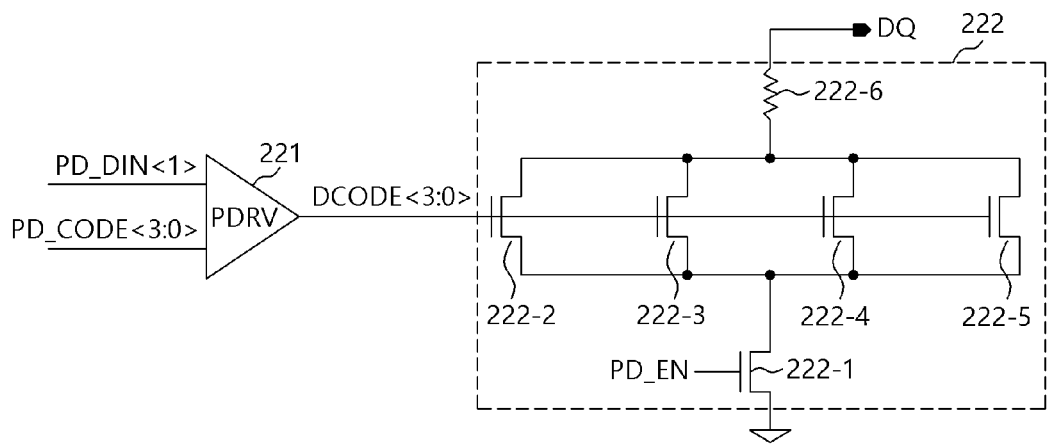
FIG. 11 is a diagram illustrating a configuration of any one of a plurality of pull-down legs in FIG. 10.

FIG. 11 is a diagram illustrating the configuration of any one of the plurality of pull-down legs 300 ohm 220-1, 150 ohm 220-2, 150 ohm 220-3, 150 ohm 220-4, 150 ohm 220-5, 150 ohm 220-6, and 300 ohm 220-7 in FIG. 10, for example, the pull-down leg 150 ohm 220-2.

Referring to FIG. 11, the pull-down leg 150 ohm 220-2 may include a pre-driving unit PDRV 221 and a main driving unit 222, and a circuit connection configuration may be substantially the same as that of FIG. 5. For this example, though, the main driving unit 222 may include first to fifth transistors 222-1 to 222-5 and a resistor 222-6.

Figure 12:
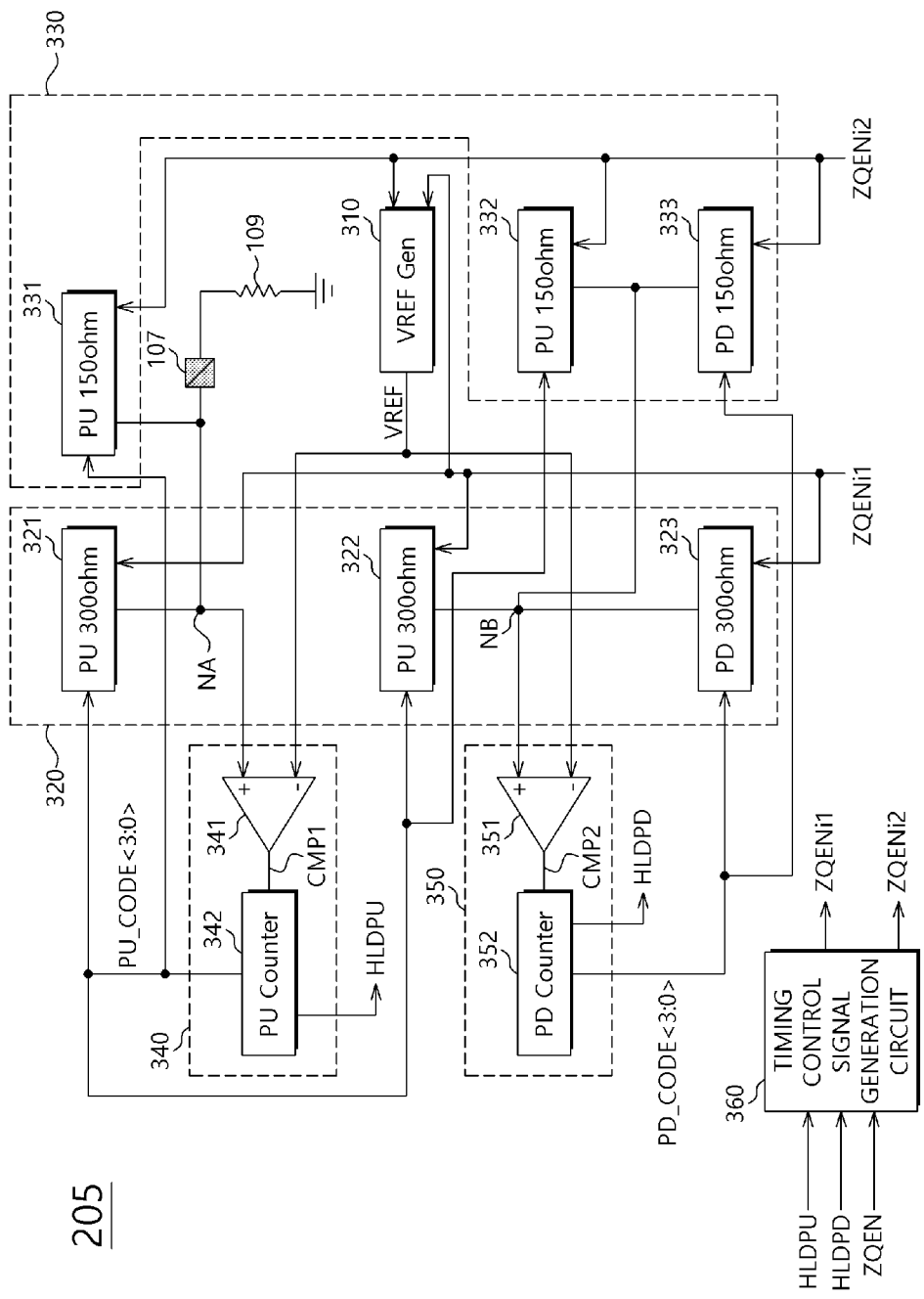
FIG. 12 is a diagram illustrating a configuration of an impedance calibration circuit in FIG. 7.

FIG. 12 is a diagram illustrating the configuration of the impedance calibration circuit 205 of FIG. 7.

Referring to FIG. 12, the impedance calibration circuit 205 may include a reference voltage generation circuit (VREF Gen) 310, a first leg set 320, a second leg set 330, a first code generation circuit 340, a second code generation circuit 350, and a timing control signal generation circuit 360.

The Reference voltage generation circuit VREF Gen 310 may generate reference voltages VREF having different levels according to the first timing control signal ZQENi1 and the second timing control signal ZQENi2. The Reference voltage generation circuit VREF Gen 310 may generate the reference voltage VREF having a first level, for example, a level of VCCQ (power supply voltage)/2 in response to the activation of the first timing control signal ZQENi1. The Reference voltage generation circuit VREF Gen 310 may generate the reference voltage VREF having a second level, for example, a level of VCCQ (power supply voltage)/1.5 in response to the activation of the second timing control signal ZQENi2. The activation of the first timing control signal ZQENi1 and the second timing control signal ZQENi2 may mean that the first timing control signal ZQENi1 and the second timing control signal ZQENi2 each have a high level.

An impedance of the first leg set 320 may be calibrated according to the first impedance control code PU_CODE<3:0> and the second impedance control code PD_CODE<3:0> during the activation period of the first timing control signal ZQENi1. The first leg set 320 may include a first duplicate leg PU 300 ohm 321, a second duplicate leg PU 300 ohm 322, and a third duplicate leg PD 300 ohm 323.

An impedance of the first duplicate leg PU 300 ohm 321 may be calibrated according to the first impedance control code PU_CODE<3:0> during the activation period of the first timing control signal ZQENi1. The first duplicate leg PU 300 ohm 321 may be configured by duplicating the pull-up leg 300 ohm 210-1 in FIG. 8, for example. The first duplicate leg PU 300 ohm 321 may be connected to the external resistor 109 through a first node NA and an external resistor pad 107.

An impedance of the second duplicate leg PU 300 ohm 322 may be calibrated according to the first impedance control code PU_CODE<3:0> during the activation period of the first timing control signal ZQENi1. The second duplicate leg PU 300 ohm 322 may be configured identically to the second duplicate leg PU 300 ohm 322. The second duplicate leg PU 300 ohm 322 may be connected to a second node NB.

An impedance of the third duplicate leg PD 300 ohm 323 may be calibrated according to the second impedance control code PD_CODE<3:0> during the activation period of the first timing control signal ZQENi1. The third duplicate leg PD 300 ohm 323 may be configured by duplicating the pull-down leg 300 ohm 220-1 in FIG. 10, for example. The third duplicate leg PD 300 ohm 323 may be connected to the second node NB.

An impedance of the second leg set 330 may be calibrated according to the first impedance control code PU_CODE<3:0> and the second impedance control code PD_CODE<3:0> during the activation period of the second timing control signal ZQENi2. The second leg set 330 may include a fourth duplicate leg PU 150 ohm 331, a fifth duplicate leg PU 150 ohm 332, and a sixth duplicate leg PD 150 ohm 333.

An impedance of the fourth duplicate leg PU 150 ohm 331 may be calibrated according to the first impedance control code PU_CODE<3:0> during the activation period of the second timing control signal ZQENi2. The fourth duplicate leg PU 150 ohm 331 may be configured by duplicating the pull-up leg 150 ohm 210-2 in FIG. 8. The fourth duplicate leg PU 150 ohm 331 may be connected to the first node NA in parallel with the first duplicate leg PU 300 ohm 321.

An impedance of the fifth duplicate leg PU 150 ohm 332 may be calibrated according to the first impedance control code PU_CODE<3:0> during the activation period of the second timing control signal ZQENi2. The fifth duplicate leg PU 150 ohm 332 may be configured identically to the fourth duplicate leg PU 150 ohm 331. The fifth duplicate leg PU 150 ohm 332 may be connected to the second node NB.

An impedance of the sixth duplicate leg PD 150 ohm 333 may be calibrated according to the second impedance control code PD_CODE<3:0> during the activation period of the second timing control signal ZQENi2. The sixth duplicate leg PD 150 ohm 333 may be configured by duplicating the pull-down leg 150 ohm 220-2 in FIG. 10, for example. The sixth duplicate leg PD 150 ohm 333 may be connected to the second node NB.

The first code generation circuit 340 may calibrate and output the value of the first impedance control code PU_CODE<3:0> according to the result of comparing a voltage of the first node NA with the reference voltage VREF. The first code generation circuit 340 may include a comparator 341 and a counter PU Counter 342. The comparator 341 may output, as a first comparison signal CMP1, the result of comparing the voltage of the first node NA with the reference voltage VREF. The counter PU Counter 342 may calibrate the value of the first impedance control code PU_CODE<3:0> according to the first comparison signal CMP1. The counter PU Counter 342 may generate a first hold signal HLDPU by detecting a completion state of calibration of the first impedance control code PU_CODE<3:0>, that is, a bang-bang state. The counter PU Counter 342 may stop calibrating the value of the first impedance control code PU_CODE<3:0> according to the detection of the bang-bang state, that is, activation of the first hold signal HLDPU, and substantially maintain the value as a final value. The bang-bang state means that when a variation in the impedance value of the first duplicate leg PU 300 ohm 321 according to the minimum unit calibration of the first impedance control code PU_CODE<3:0> is within an error range, a corresponding code bit is not fixed and continuously repeats '0' and '1'.

The second code generation circuit 350 may calibrate and output the value of the second impedance control code PD_CODE<3:0> according to the result of comparing a voltage of the second node NB with the reference voltage VREF. The second code generation circuit 350 may include a comparator 351 and a counter PD Counter 352. The comparator 351 may compare the voltage of the second node NB with the reference voltage VREF and output the comparison result as a second comparison signal CMP2. The counter PD Counter 352 may calibrate the value of the second impedance control code PD_CODE<3:0> according to the second comparison signal CMP2. The PD counter Counter 352 may generate a second hold signal HLDPD by detecting a bang-bang state of the second impedance control code PD_CODE<3:0>. The counter PD Counter 352 may stop calibrating the value of the second impedance control code PD_CODE<3:0> according to the detection of the bang-bang state, that is, activation of the second hold signal HLDPD, and substantially maintain the value as a final value. The counter PD Counter 352 may be configured identically to the counter PU Counter 342 of the first code generation circuit 340.

The timing control signal generation circuit 360 may receive the first hold signal HLDPU, the second hold signal HLDPD, and the impedance calibration enable signal ZQEN, and output the first timing control signal ZQENi1 and the second timing control signal ZQENi2. The timing control signal generation circuit 360 may generate the first timing control signal ZQENi1 and the second timing control signal ZQENi2 to have different activation periods.

Figure 13:
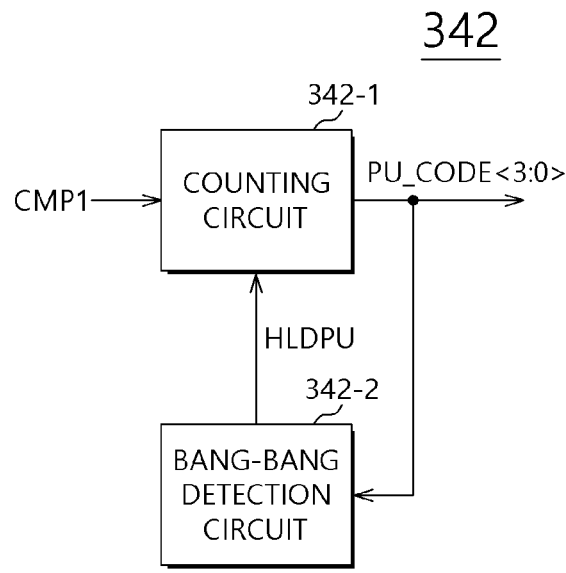
FIG. 13 is a diagram illustrating a configuration of a counter in FIG. 12.

FIG. 13 is a diagram illustrating the configuration of the PU Counter 342 in FIG. 12.

Referring to FIG. 13, the counter PU Counter 342 may include a counting circuit 342-1 and a bang-bang detection circuit 342-2. The counting circuit 342-1 may calibrate the value of the first impedance control code PU_CODE<3:0> according to the first comparison signal CMP1. The counting circuit 342-1 may fix the value of the first impedance control code PU_CODE<3:0> regardless of the first comparison signal CMP1 in response to the activation of the first hold signal HLDPU. The bang-bang detection circuit 342-2 may detect the bang-bang state of the first impedance control code PU_CODE<3:0> and activate the first hold signal HLDPU. The bang-bang detection circuit 342-2 may detect that the bang-bang state of the first impedance control code PU_CODE<3:0> is released, and deactivate the first hold signal HLDPU.

Figure 14:
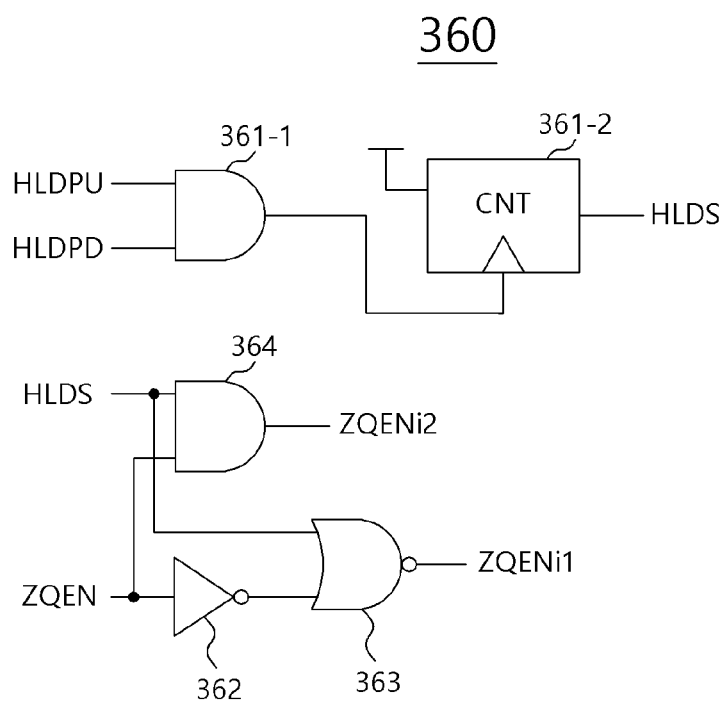
FIG. 14 is a diagram illustrating a configuration of a timing control signal generation circuit in FIG. 12.

FIG. 14 is a diagram illustrating the configuration of the timing control signal generation circuit 360 in FIG. 12.

Referring to FIG. 14, the timing control signal generation circuit 360 may include a plurality of logic gates 361-1, 362, 363, and 364 and a counter CNT 361-2.

A first logic gate 361-1 may output a result of ANDing the first hold signal HLDPU and the second hold signal HLDPD. The counter CNT 361-2 may output, as a timing reference signal HLDS, a signal generated by counting the output of the first logic gate 361-1. The counter CNT 361-2 may be configured as, for example, a binary counter, and may output the least significant bit of an output signal as the timing reference signal HLDS. A second logic gate 362 may invert and output the impedance calibration enable signal ZQEN. A third logic gate 363 may output a result of NORing the output of the second logic gate 362 and the timing reference signal HLDS as the first timing control signal ZQENi1. A fourth logic gate 364 may output a result of ANDing the impedance calibration enable signal ZQEN and the timing reference signal HLDS as the second timing control signal ZQENi2.

The impedance calibration circuit 205 in accordance with an embodiment of the present disclosure may perform an impedance calibration operation including a plurality of calibration loops, for example, a first calibration loop and a second calibration loop. Accordingly, the activation period of the impedance calibration enable signal ZQEN may be divided into a period for the first calibration loop and a period for the second calibration loop. The first timing control signal ZQENi1 may be used as a signal for defining a period for the first calibration loop, and the second timing control signal ZQENi2 may be used as a signal for defining a period for the second calibration loop. Since the second timing control signal ZQENi2 is a signal for defining a period for executing the second calibration loop, it needs to be activated after the first calibration loop is completed. The first calibration loop may be completed after calibration of the first impedance control code PU_CODE<3:0> and the second impedance control code PD_CODE<3:0> is completed. That is, the first calibration loop may be completed after the time point at which both the first hold signal HLDPU capable of defining the calibration completion timing of the first impedance control code PU_CODE<3:0> and the second hold signal HLDPD capable of defining the calibration completion timing of the second impedance control code PD_CODE<3:0> are activated. The completion time point of the second calibration loop may also be after the time point at which both the first hold signal HLDPU and the second hold signal HLDPD are activated.

Accordingly, the timing reference signal HLDS may be generated by counting the result of ANDing the first hold signal HLDPU and the second hold signal HLDPD, and a signal obtained by ANDing the impedance calibration enable signal ZQEN and the timing reference signal HLDS may be used as the second timing control signal ZQENi2. Although not illustrated in the drawings, the first impedance control code PU_CODE<3:0> and the second impedance control code PD_CODE<3:0> may be calibrated at the same time, but since the calibration of the second impedance control code PD_CODE<3:0> may be completed after the calibration of the first impedance control code PU_CODE<3:0> is completed. Accordingly, the timing reference signal HLDS may also be generated by counting the second hold signal HLDPD.

The activation period of the first timing control signal ZQENi1 may be a period from the activation timing of the impedance calibration enable signal ZQEN to the activation timing of the timing reference signal HLDS, and the activation period of the second timing control signal ZQENi2 may be a period from the activation timing of the timing reference signal HLDS to a preceding timing between the deactivation timing of the timing reference signal HLDS and the deactivation timing of the impedance calibration enable signal ZQEN.

Figure 15:
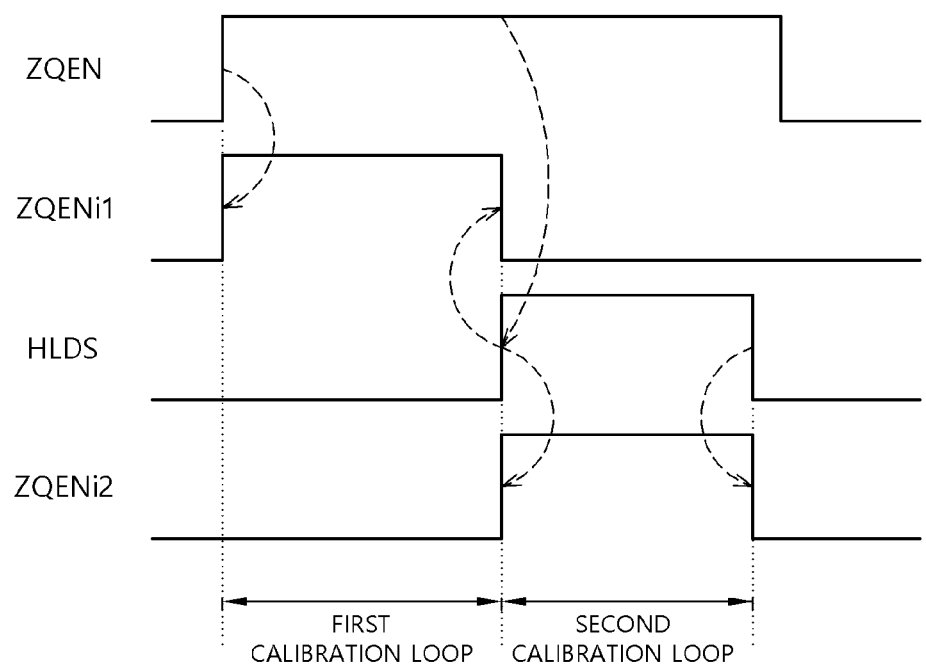
FIG. 15 is a timing diagram for explaining an impedance calibration method in accordance with an embodiment of the present disclosure.

FIG. 15 is a timing diagram illustrating an impedance calibration method in accordance with an embodiment of the present disclosure. Hereinafter, the impedance calibration method in accordance with an embodiment of the present disclosure will be described with reference to FIGS. 7 to 15.

The impedance calibration operation may be performed for a time specified in the operation standard of the semiconductor apparatus (for example, an initialization period) or according to a request from the outside of the semiconductor apparatus.

The impedance calibration enable signal ZQEN for defining an impedance calibration period may be activated, and accordingly, the first timing control signal ZQENi1 may be activated.

The first calibration loop may be executed during the period in which the first timing control signal ZQENi1 is activated. The first calibration loop may be an operation for allowing the impedances of the first duplicate leg PU 300 ohm 321, the second duplicate leg PU 300 ohm 322, and the third duplicate leg PD 300 ohm 323 of the first leg set 320 to match the first target impedance, that is, 300 ohm. As the first calibration loop is executed, the first impedance control code PU_CODE<3:0> and the second impedance control code PD_CODE<3:0> may be calibrated. As the execution of the first calibration loop is completed, that is, as the first impedance control code PU_CODE<3:0> is fixed to a first value and the second impedance control code PD_CODE<3:0> is fixed to a second value, the timing reference signal HLDS may be activated and the first timing control signal ZQENi1 may be deactivated by the activated timing reference signal HLDS.

While the first calibration loop is executed, the first impedance control code PU_CODE<3:0> and the second impedance control code PD_CODE<3:0> may be provided to the pull-up leg 300 ohm 210-1 and the pull-up leg 300 ohm 210-7 of the first driver 201 and the pull-down leg 300 ohm 220-1 and the pull-down leg 300 ohm 220-7 of the second driver 203. As the first timing control signal ZQENi1 is deactivated, the impedances of the pull-up leg 300 ohm 210-1 and the pull-up leg 300 ohm 210-7 of the first driver 201 and the pull-down leg 300 ohm 220-1 and the pull-down leg 300 ohm 220-7 of the second driver 203 may each be calibrated to 300 ohm by the first impedance control code PU_CODE<3:0> having the first value and the second impedance control code PD_CODE<3:0> having the second value.

As the timing reference signal HLDS is activated, the first timing control signal ZQENi1 may be deactivated and the second timing control signal ZQENi2 may be activated.

The second calibration loop may be executed during the period in which the second timing control signal ZQENi2 is activated. The second calibration loop may be an operation for allowing the impedances of the fourth duplicate leg PU 150 ohm 331, the fifth duplicate leg PU 150 ohm 332, and the sixth duplicate leg PD 150 ohm 333 of the second leg set 330 to match the second target impedance, that is, 150 ohm. As the second calibration loop is executed, the first impedance control code PU_CODE<3:0> and the second impedance control code PD_CODE<3:0> may be calibrated. As the execution of the second calibration loop is completed, that is, the first impedance control code PU_CODE<3:0> is fixed to a third value and the second impedance control code PD_CODE<3:0> is fixed to a fourth value, the timing reference signal HLDS may be deactivated and accordingly, the second timing control signal ZQENi2 may be deactivated. In such a case, the first value, the second value, the third value, and the fourth value may be different from one another.

While the second calibration loop is executed, the first impedance control code PU_CODE<3:0> and the second impedance control code PD_CODE<3:0> may be provided to the pull-up leg 150 ohm 210-2 to the pull-up leg 150 ohm 210-6 of the first driver 201 and the pull-down leg 150 ohm 220-2 to the pull-down leg 150 ohm 220-6 of the second driver 203. As the second timing control signal ZQENi2 is deactivated, the impedances of the pull-up leg 150 ohm 210-2 to the pull-up leg 150 ohm 210-6 of the first driver 201 and the pull-down leg 150 ohm 220-2 to the pull-down leg 150 ohm 220-6 of the second driver 203 may be calibrated to 150 ohm by the first impedance control code PU_CODE<3:0> having the third value and the second impedance control code PD_CODE<3:0> having the fourth value.

According to an embodiment of the present disclosure, when drivers for outputting data of a semiconductor apparatus are designed to have different target impedances, an impedance calibration operation is not performed on the basis of one target impedance within a time specified in the semiconductor operation standard, that is, within the activation period of the impedance calibration enable signal ZQEN, but an impedance calibration operation including a plurality of calibration loops divided according to respective target impedances may be performed. Therefore, in an embodiment, operating characteristics of the drivers may be improved.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. An impedance calibration circuit comprising:
a first leg set in which among first to third duplicate legs, the first duplicate leg is connected to an external resistor through a first node and the second duplicate leg and the third duplicate leg are connected to a second node, an impedance of the first leg set being calibrated to a first target impedance according to a first impedance control code and a second impedance control code during an activation period of a first timing control signal;
a second leg set in which among fourth to sixth duplicate legs, the fourth duplicate leg is connected to the external resistor and the fifth duplicate leg and the sixth duplicate leg are connected to the second node, an impedance of the second leg set being calibrated to a second target impedance according to the first impedance control code and the second impedance control code during an activation period of a second timing control signal;
a first code generation circuit configured to calibrate and output a value of the first impedance control code according to a result of comparing a voltage of the first node with a reference voltage, and to generate a first hold signal by detecting a completion state of the calibration of the first impedance control code;
a second code generation circuit configured to calibrate and output a value of the second impedance control code according to a result of comparing a voltage of the second node with the reference voltage, and to generate a second hold signal by detecting a completion state of the calibration of the second impedance control code; and
a timing control signal generation circuit configured to generate the first timing control signal and the second timing control signal having different activation periods in response to an impedance calibration enable signal and at least one of the first hold signal and the second hold signal.

2. The impedance calibration circuit according to claim 1, further comprising:
a reference voltage generation circuit configured to generate the reference voltage having a first level in response to the first timing control signal and to generate the reference voltage having a second level in response to the second timing control signal.

3. The impedance calibration circuit according to claim 1, wherein the timing control signal generation circuit is configured to generate the first timing control signal by performing a logical operation on a timing reference signal and the impedance calibration enable signal, the timing reference signal being generated by counting a result of a logical operation of the first hold signal and the second hold signal, and
to generate the second timing control signal by performing a logical operation on the timing reference signal and the impedance calibration enable signal.

4. The impedance calibration circuit according to claim 1, wherein the timing control signal generation circuit is configured to generate a timing reference signal by counting the second hold signal,
to generate the second timing control signal by performing a logical operation on the timing reference signal and the impedance calibration enable signal, and
to generate the first timing control signal by performing a logical operation on the timing reference signal and the impedance calibration enable signal.

5. A semiconductor apparatus comprising:
a driver comprising a first leg group having an impedance that is calibrated to a first target impedance according to an impedance control code having a first value and a second leg group having an impedance that is calibrated to a second target impedance according to the impedance control code calibrated to a second value; and
an impedance calibration circuit comprising a first leg set and a second leg set, and configured to generate the impedance control code having the first value by calibrating an impedance of the first leg set for a first time allocated to a first calibration loop and to generate the impedance control code calibrated to the second value by calibrating an impedance of the second leg set for a second time allocated to a second calibration loop so as not to overlap the first time,
wherein the driver comprises:
a code transmission control circuit configured to provide the first leg group with the impedance control code having the first value during an activation period of a first timing control signal for defining the first time, and to provide the second leg group with the impedance control code calibrated to the second value during an activation period of a second timing control signal for defining the second time.

6. The semiconductor apparatus according to claim 5, wherein the impedance calibration circuit comprises:
a code generation circuit configured to calibrate and output the value of the impedance control code according to a result of comparing a voltage of a node, to which the first leg set is connected, with a reference voltage; and
a timing control signal generation circuit configured to generate the first timing control signal and the second timing control signal having different activation periods in response to an impedance calibration enable signal.

7. The semiconductor apparatus according to claim 6, further comprising:
a reference voltage generation circuit configured to generate the reference voltage having a first level in response to the first timing control signal and to generate the reference voltage having a second level in response to the second timing control signal.

8. The semiconductor apparatus according to claim 6, wherein the code generation circuit comprises:
a comparator configured to output, as a comparison signal, the result of comparing the voltage of the node to which the first leg set is connected with the reference voltage; and
a counter configured to calibrate the value of the impedance control code according to the comparison signal, and to generate a hold signal by detecting a completion state of the calibration of the impedance control code.

9. The semiconductor apparatus according to claim 8, wherein the counter comprises:
a counting circuit configured to calibrate the value of the impedance control code according to the comparison signal and to fix the value of the impedance control code regardless of the comparison signal in response to activation of the hold signal; and
a bang-bang detection circuit configured to detect the completion state of the calibration of the impedance control code and to activate the hold signal.

10. The semiconductor apparatus according to claim 6, wherein the timing control signal generation circuit is configured to generate the first timing control signal and the second timing control signal in response to the impedance calibration enable signal and a hold signal.

* * * * *